US012607652B2

(12) United States Patent
Kuo et al.

(10) Patent No.: US 12,607,652 B2
(45) Date of Patent: Apr. 21, 2026

(54) SENSING ELECTRONIC DEVICE

(71) Applicant: InnoLux Corporation, Miao-Li County (TW)

(72) Inventors: Chao-Yin Kuo, Miao-Li County (TW); Yi-Chen Chou, Miao-Li County (TW); Wen-Hsiang Liao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 248 days.

(21) Appl. No.: 18/173,659

(22) Filed: Feb. 23, 2023

(65) Prior Publication Data

US 2023/0305037 A1    Sep. 28, 2023

(30) Foreign Application Priority Data

Mar. 23, 2022    (CN) .......................... 202210291570.5

(51) Int. Cl.
G01R 17/02 (2006.01)
G01R 1/067 (2006.01)
G01R 1/28 (2006.01)
G01R 31/30 (2006.01)

(52) U.S. Cl.
CPC ........... G01R 1/28 (2013.01); G01R 1/06766 (2013.01); G01R 31/3004 (2013.01)

(58) Field of Classification Search
CPC .. G01R 31/3004; G01R 1/28; G01R 1/06766; G01N 27/4148; G01N 27/414; G01N 27/4145; G01N 27/4146; G01N 27/301
See application file for complete search history.

(56) References Cited

U.S. PATENT DOCUMENTS

| | | | |
|---|---|---|---|
| 11,543,402 B2 * | 1/2023 | O'Dwyer | ............... G01N 33/49 |
| 2013/0053268 A1 * | 2/2013 | Frederix | .............. C12Q 1/6825 |
| | | | 506/18 |
| 2013/0221346 A1 | 8/2013 | Lu et al. | |
| 2015/0091846 A1 * | 4/2015 | Small | .................... G06F 3/0443 |
| | | | 345/174 |
| 2018/0053466 A1 * | 2/2018 | Zhang | ................... G01L 1/2281 |
| 2018/0218191 A1 * | 8/2018 | Berget | .............. G06V 40/1306 |
| 2022/0042943 A1 * | 2/2022 | Rothberg | ........... G01N 27/4148 |
| 2022/0146450 A1 * | 5/2022 | Wong | ................. G01N 27/4145 |
| 2022/0302244 A1 * | 9/2022 | Yuan | .................... H10K 50/813 |

(Continued)

FOREIGN PATENT DOCUMENTS

| | | |
|---|---|---|
| CN | 103154718 B | 9/2015 |
| CN | 105988059 A | 10/2016 |

(Continued)

*Primary Examiner* — Thang X Le
(74) *Attorney, Agent, or Firm* — Muncy, Geissler, Olds & Lowe, P.C.

(57) ABSTRACT

A sensing electronic device includes a substrate, and a reference voltage control unit. The sensing array is arranged on the substrate, and includes a first sensing electrode and a second sensing electrode. The reference voltage control unit is electrically connected to the sensing array. In an operation period, the reference voltage control unit has a first voltage, the first sensing electrode has a second voltage, and the second sensing electrode has a third voltage, wherein a difference between the first voltage and the second voltage is different from a difference between the first voltage and the third voltage.

6 Claims, 9 Drawing Sheets

(56)             References Cited

U.S. PATENT DOCUMENTS

| 2022/0319222 A1* | 10/2022 | Liu | ...................... | G11C 19/287 |
| 2023/0243774 A1* | 8/2023 | Yasuo | ................... | C12M 41/48 |
| | | | | 204/400 |

FOREIGN PATENT DOCUMENTS

| TW | 201409026 A | 3/2014 |
| WO | 2021246070 A | 12/2021 |

* cited by examiner

1

SENSING ELECTRONIC DEVICE

CROSS-REFERENCE TO RELATED APPLICATIONS

This application claims the benefits of the Chinese Patent Application Serial Number 202210291570.5, filed on Mar. 23, 2022, the subject matter of which is incorporated herein by reference.

BACKGROUND

Field

The present disclosure provides a sensing electronic device and, more particularly, to a sensing electronic device capable of simultaneously sensing different to-be-tested objects.

Description of Related Art

Typically, most of the sensing electronic devices are subject to single sensing, which can only detect one type of to-be-tested object at a time. In order to detect a variety of to-be-tested objects, the sensing electronic device has to be replaced and operated repeatedly, which not only is inconvenient in operation, but also increases the operation time. In addition, after detection, the to-be-tested object is likely to be adsorbed to the surface of the sensing electrode of the sensing electronic device, and is difficult to be desorbed, resulting in a shortened service life of the sensing electrode.

Therefore, there is a need to provide a sensing electronic device so as to mitigate and/or obviate the defects of the prior sensing electronic device.

SUMMARY

The present disclosure provides a sensing electronic device, which includes: a substrate; a sensing array arranged on the substrate, wherein the sensing array includes a first sensing electrode and a second sensing electrode; and a reference voltage control unit electrically connected to the sensing array. In an operation period, the reference voltage control unit has a first voltage, the first sensing electrode has a second voltage, and the second sensing electrode has a third voltage, wherein a difference between the first voltage and the second voltage is different from a difference between the first voltage and the third voltage.

The present disclosure further provides a sensing electronic device, which includes: a substrate; and a sensing array arranged on the substrate, wherein the sensing array includes a first sensing electrode, a second sensing electrode, a first reference electrode and a second reference electrode, the first sensing electrode corresponds to the first reference electrode, and the second sensing electrode corresponds to the second reference electrode. In an operation period, the first reference electrode has a first voltage, and the second reference electrode has a second voltage, in which the first voltage is the same as the second voltage.

The present disclosure further provides a sensing electronic device, which includes: a substrate; and a sensing array arranged on the substrate, and including a first sensing area, a second sensing area, a third sensing area and a fourth sensing area arranged in a matrix form, wherein the first sensing area includes a first transistor and a first sensing electrode electrically connected to the first transistor, the second sensing area includes a second transistor and a second sensing electrode electrically connected to the second transistor, the third sensing area includes a third transistor and a third sensing electrode electrically connected to the third transistor, and the fourth sensing area includes a fourth transistor and a fourth sensing electrode electrically connected to the fourth transistor. The first transistor is electrically connected to the third transistor, and the second transistor is electrically connected to the fourth transistor.

The present disclosure further provides a sensing electronic device, which includes: a substrate; and a sensing array arranged on the substrate, and including a first sensing area, a second sensing area, a third sensing area and a fourth sensing area arranged in a matrix form, wherein the first sensing area includes a first transistor and a first sensing electrode electrically connected to the first transistor, the second sensing area includes a second transistor and a second sensing electrode electrically connected to the second transistor, the third sensing area includes a third transistor and a third sensing electrode electrically connected to the third transistor, and the fourth sensing area includes a fourth transistor and a fourth sensing electrode electrically connected to the fourth transistor, wherein, the first transistor is electrically connected to the third transistor, and the second transistor is electrically connected to the fourth transistor.

Other novel features of the disclosure will become more apparent from the following detailed description when taken in conjunction with the accompanying drawings.

DETAILED DESCRIPTION OF EMBODIMENT

Figure 1:
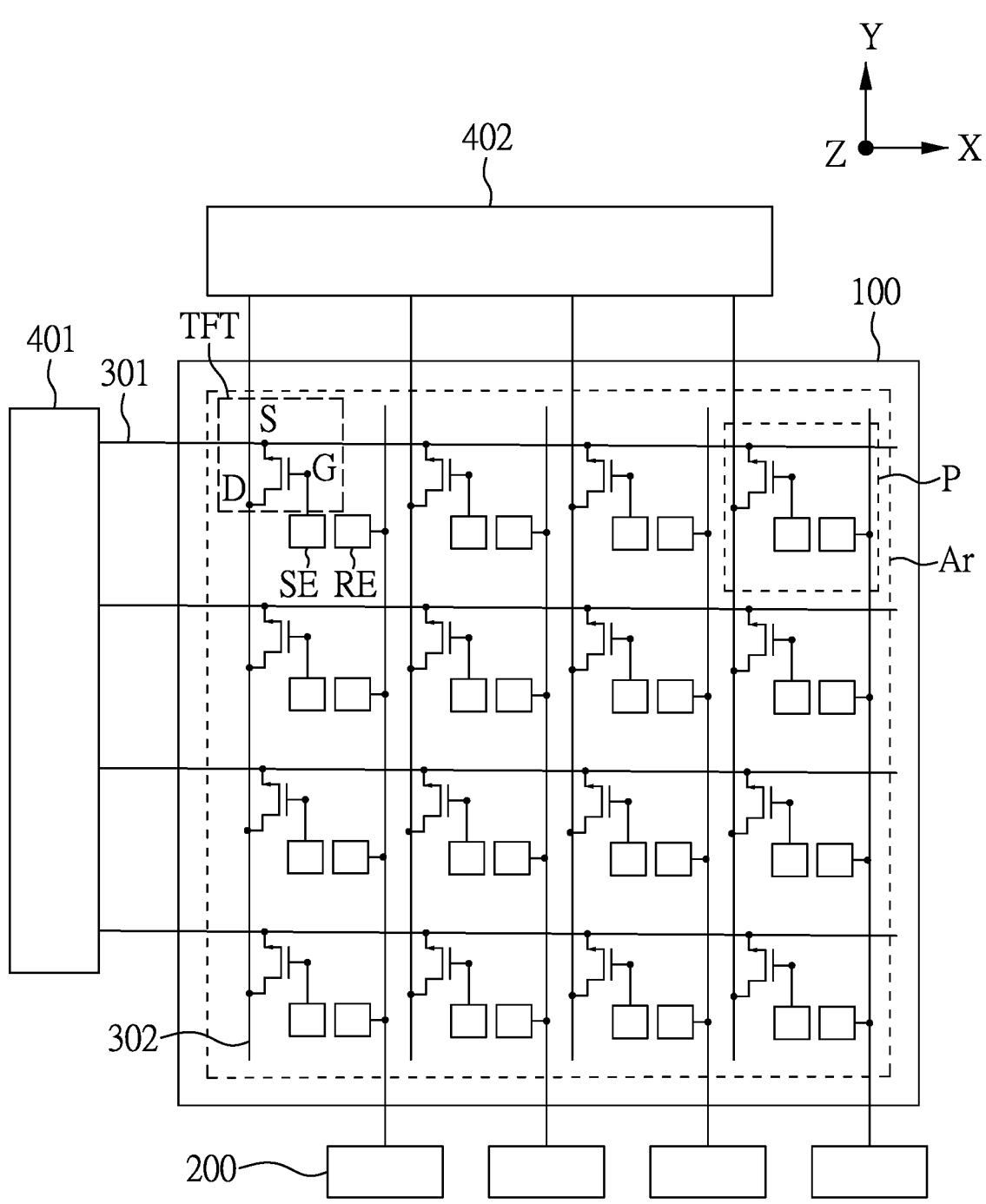
FIG. 1 is a schematic diagram of a sensing array of a sensing electronic device according to an embodiment of the present disclosure.

The implementation of the present disclosure is illustrated by specific embodiments to enable persons skilled in the art to easily understand the other advantages and effects of the present disclosure by referring to the disclosure contained therein. The present disclosure is implemented or applied by other different, specific embodiments. Various modifications and changes can be made in accordance with different viewpoints and applications to details disclosed herein without departing from the spirit of the present disclosure.

It should be noted that, in the specification and claims, unless otherwise specified, having "one" element is not limited to having a single said element, but one or more said elements may be provided. Furthermore, in the specification and claims, unless otherwise specified, ordinal numbers, such as "first", "second", etc., used herein are intended to distinguish elements rather than disclose explicitly or implicitly that names of the elements bear the wording of the ordinal numbers. The ordinal numbers do not imply what order an element and another element are in terms of space, time or steps of a manufacturing method.

In the entire specification and the appended claims of the present disclosure, certain words are used to refer to specific components. Those skilled in the art should understand that electronic device manufacturers may refer to the same components by different names. The present disclosure does not intend to distinguish those components with the same function but different names. In the claims and the following description, the words "comprise", "include" and "have" are open type language, and thus they should be interpreted as meaning "including but not limited to . . . ". Therefore, when the terms "comprise", "include" and/or "have" are used in the description of the present disclosure, they specify the existence of corresponding features, regions, steps, operations and/or components, but do not exclude the existence of one or more corresponding features, regions, steps, operations and/or components.

In the description, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

Unless otherwise defined, all terms (including technical and scientific terms) used here have the same meanings as commonly understood by those skilled in the art of the present disclosure. It is understandable that these terms, such as those defined in commonly used dictionaries, should be interpreted as having a meaning consistent with the relevant technology and the background or context of the present disclosure, rather than in an idealized or excessively formal interpretation, unless specifically defined.

In addition, relative terms such as "below" or "bottom", and "above" or "top" may be used in the embodiments to describe the relationship between one component and another component in the drawing. It can be understood that, if the device in the drawing is turned upside down, the components described on the "lower" side will become the components on the "upper" side. When the corresponding member (such as a film or region) is described as "on another member", it may be directly on the other member, or there may be other members between the two members. On the other hand, when a member is described as "directly on another member", there is no member between the two members. In addition, when a member is described as "on another member", the two members have a vertical relationship in the top view direction, and this member may be above or below the other member, while the vertical relationship depends on the orientation of the device.

It should be noted that the technical solutions provided by the different embodiments described hereinafter may be used interchangeably, combined or mixed to form another embodiment without violating the spirit of the present disclosure.

FIG. 1 is a schematic diagram of a sensing array of a sensing electronic device according to an embodiment of the present disclosure. The sensing electronic device of the present disclosure may be applied to self-luminous devices, non-self-luminous devices, and antenna devices, but the present disclosure is not limited thereto.

As shown in FIG. 1, the sensing electronic device of the present disclosure includes: a substrate 100; a sensing array Ar arranged on the substrate 100; and a reference voltage control unit 200 electrically connected to the sensing array Ar. The sensing array Ar includes a plurality of sensing areas P, each sensing area P having a transistor TFT; a sensing electrode SE electrically connected to the transistor TFT; and a reference electrode RE arranged corresponding to the sensing electrode SE and electrically connected to a reference voltage control unit 200, wherein the "corresponding" refers to that, when a voltage is applied to the reference electrode RE, the corresponding sensing electrode SE has a voltage, and the "electrically connected to" refers to being electrically connected to each other through direct contact or indirect contact via conductive materials such as a conductive medium layer. In the present disclosure, the number of sensing areas P is not particularly limited. For example, the sensing array Ar shown in FIG. 1 includes 16 sensing areas P, which are arranged in a 4×4 matrix, but the present disclosure is not limited thereto.

Furthermore, as shown in FIG. 1, each transistor TFT may include a gate G electrically connected to the sensing electrode SE; and a source S and a drain D electrically connected to the driving units 401 and 402 respectively through a first conductive wire 301 and a second conductive wire 302 to transmit or receive signals. For example, the driving unit 401 may be, for example, a scan driver, and the driving unit 402 may be, for example, a data driver, but the present disclosure is not limited thereto. In addition, the sensing electrodes SE in each sensing area P may be the same or different and, when the sensing electrodes SE are different, different to-be-tested objects may be detected at the same time. In this embodiment, as shown in FIG. 1, the reference electrode RE may be arranged adjacent to the corresponding sensing electrode SE, but the present disclosure is not limited thereto.

Figure 2A:
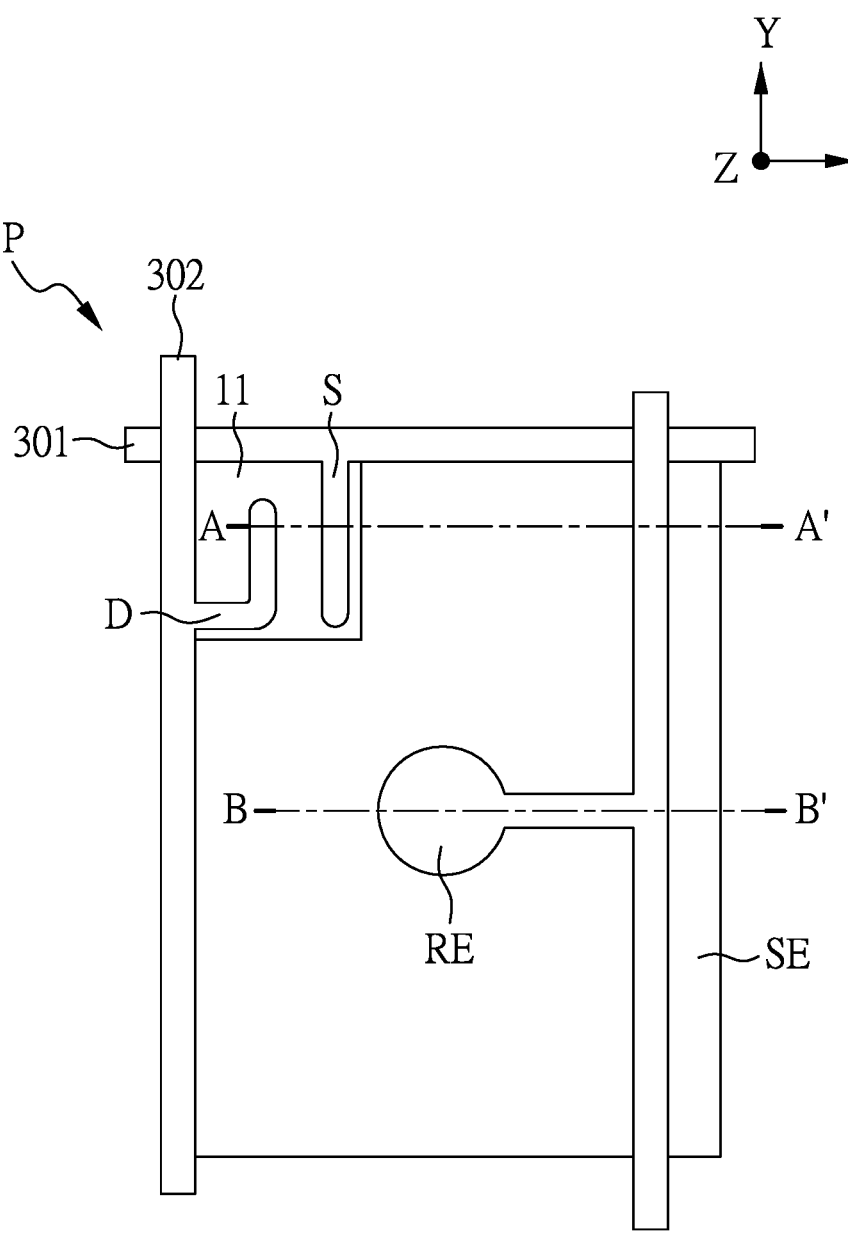
FIG. 2A is a schematic diagram of a sensing pixel unit according to an embodiment of the present disclosure.
Figure 2B:
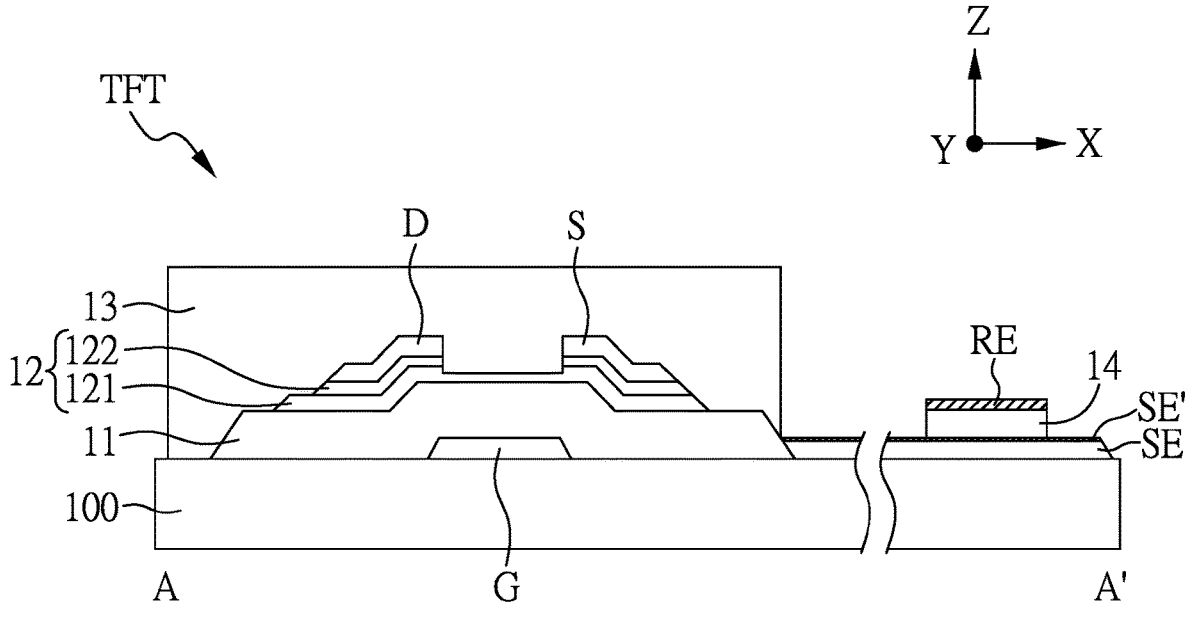
FIG. 2B is a cross-sectional view taken along line A-A' of FIG. 2A.
Figure 2C:
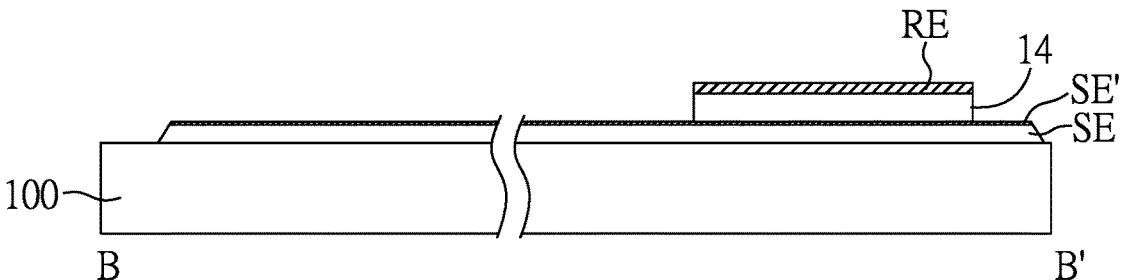
FIG. 2C is a cross-sectional view taken along line B-B' of FIG. 2A.

FIG. 2A is a schematic diagram of a sensing area according to an embodiment of the present disclosure. FIG. 2B is a cross-sectional view of FIG. 2A taking along line A-A'. FIG. 2C is a cross-sectional view of FIG. 2A taking along line B-B'. For convenience of description, some components, such as the gate G, the insulation layer 13 and the like, are omitted in FIG. 2A.

The sensing array Ar of the present disclosure (as shown in FIG. 1) is mainly prepared through a transistor process technology, such as a thin film transistor process (TFT process), so that the sensing array Ar is arranged on a substrate 100. As shown in FIG. 2A and FIG. 2B, at first, a substrate 100 is provided, and the material of the substrate 100 may be a non-flexible substrate, a flexible substrate, a thin film or a combination thereof. The material of the substrate 100 may include a quartz, a glass, a silicon wafer, a sapphire, polycarbonate (PC), polyimide (PI), polypropylene (PP), polyethylene terephthalate (PET), or other plastic or polymer materials, or a combination thereof, but the present disclosure is not limited thereto.

A first conductor layer is formed on the substrate 100, which includes a gate G and a sensing electrode SE, wherein the first conductor layer may include a single-layer stack or a multi-layer stack. The materials of the gate G and the sensing electrode SE may each include a metal, a conductive metal oxide, or a combination thereof, but the present disclosure is not limited thereto. Examples of the metal include copper (Cu), nickel (Ni), gold (Au), silver (Ag), aluminum (Al), titanium (Ti), chromium (Cr), molybdenum (Mo), metal alloys, or a combination thereof, but the present disclosure is not limited thereto. Examples of conductive metal oxide include indium tin oxide (ITO), indium zinc oxide (IZO), indium tin zinc oxide (ITZO), indium gallium zinc oxide (IGZO), or aluminum zinc oxide (AZO), but the present disclosure is not limited thereto. Furthermore, the gate G and the sensing electrode SE may be fabricated using the same or different materials/processes. In one embodiment of the present disclosure, the materials of the gate G and the sensing electrode SE may be indium tin oxide. In one embodiment of the present disclosure, the materials of the gate G and the sensing electrode SE may be titanium-aluminum-titanium (Ti—Al—Ti). In this embodiment, although not shown, in other cross sections, the sensing electrode SE may be electrically connected to the gate G, so as to transmit the signal of the sensing electrode SE to the gate G.

Next, a gate insulation layer 11 is formed on the conductor layer, and the gate insulation layer 11 is arranged on the gate G. The material of the gate insulation layer 11 may include silicon oxide, silicon nitride, silicon oxynitride, aluminum oxide, resin, polymer, photoresist, or a combination thereof, but the present disclosure is not limited thereto.

Then, an active layer 12 is formed on the gate insulation layer 11, and the active layer 12 is arranged on the gate G. In a normal direction Z of the substrate 100, the active layer 12 and the gate G at least partially overlap; for example, part of the active layer 12 overlaps the gate G, the active layer 12 overlaps part of the gate G, or the active layer 12 and the gate G overlap each other. The material of the active layer 12 may include amorphous silicon (a-Si), low temperature polysilicon (LTPS), or metal oxide. Examples of metal oxide include indium gallium zinc oxide (IGZO), aluminum indium zinc oxide (AIZO), hafnium indium zinc oxide (HIZO), indium tin zinc oxide (ITZO), indium gallium zinc tin oxide (IGZTO) or indium gallium tin oxide (IGTO), but the present disclosure is not limited thereto. In one embodiment of the present disclosure, the material of the active layer 12 may be low temperature polysilicon.

In the present disclosure, as shown in FIG. 2B, the active layer 12 may include a polysilicon layer 121 and a doping layer 122, wherein the doping layer 122 is arranged on the polysilicon layer 121. The doping layer 122 may be an n-type amorphous silicon layer, but the present disclosure is not limited thereto.

Next, a second conductor layer is formed on the active layer 12. The second conductor layer may include a single-layer stack or a multi-layer stack, and the second conductor layer includes a source S and a drain D, wherein the source S and the drain D are electrically connected to the active layer 12. The material of the second conductor layer may include copper, nickel, gold, aluminum, titanium, chromium, molybdenum, tungsten, platinum, alloys thereof, or a combination thereof, but the present disclosure is not limited thereto.

The transistor TFT thus formed includes: a gate G; part of the gate insulation layer 11 arranged on the gate G; an active layer 12 arranged on the gate insulation layer 11 and arranged on the gate G; and a source S and a drain D arranged on the active layer 12 and respectively electrically connected to the active layer 12. In addition, as shown in FIG. 2B, the active layer 12 further includes a polysilicon layer 121 and a doping layer 122, wherein the doping layer 122 is arranged on the polysilicon layer 121, and the source S and the drain D are arranged respectively corresponding to the doping layer 122.

Then, an insulation layer 13 is formed on the transistor TFT. The material of the insulation layer 13 may include silicon oxide, silicon nitride, silicon oxynitride, aluminum oxide, resin, polymer, photoresist or a combination thereof, but the present disclosure is not limited thereto. Therefore, the sensing array Ar of the present disclosure may further include an insulation layer 13 arranged on the transistor TFT.

In addition, as shown in FIG. 2B and FIG. 2C, a sensing unit SE' may be further provided on the sensing electrode SE for detecting the to-be-tested object. The sensing unit SE' may be a biological material, such as biological tissue, microorganism, organelle, cell sensor, enzyme, antibody, nucleic acid, biologically derived material or biomimetic material, but the present disclosure is not limited thereto.

In the present disclosure, a reference electrode RE may be formed on the substrate 100. More specifically, in this embodiment, as shown in FIG. 2B and FIG. 2C, the reference electrode RE may be arranged on the sensing electrode SE. In other words, in the normal direction Z of the substrate 100, the reference electrode RE may overlap the sensing electrode SE. In other embodiments of the present disclosure, an insulation layer 14 is arranged between the reference electrode RE and the sensing electrode SE. In other embodiments of the present disclosure, the reference electrode RE and the sensing electrode SE are separated from each other, but the present disclosure is not limited thereto. However, in other embodiments of the present disclosure, as shown in FIG. 1, the reference electrode RE may be arranged adjacent to the sensing electrode SE. In other words, in the normal direction Z of the substrate 100, the reference electrode RE does not overlap the sensing electrode SE. The material of the reference electrode RE includes silver/silver chloride, but the present disclosure is not limited thereto. The material of the insulation layer 14 is similar to that of the insulation layer 13, and thus a repeated description is deemed unnecessary.

In the present disclosure, each sensing area P shown in FIG. 1 may be replaced by the sensing area P shown in FIG. 2A to FIG. 2C, and thus a repeated description is deemed unnecessary.

Figure 3:
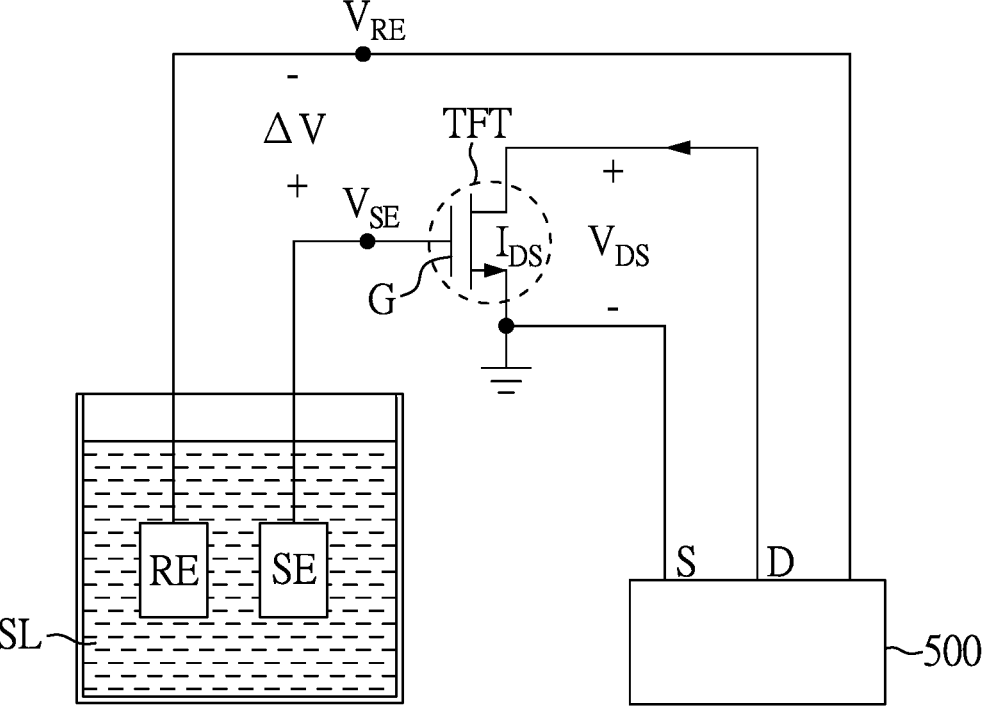
FIG. 3 is a schematic diagram of a sensing pixel unit according to an embodiment of the present disclosure.

FIG. 3 is a schematic diagram of a sensing area according to an embodiment of the present disclosure.

As shown in FIG. 3, in an operation period, the sensing electrode SE and the reference electrode RE are in contact with the to-be-tested solution SL, and the controller 500 provides a reference voltage VRE to the reference electrode RE, which will cause the to-be-tested object in the to-be-tested solution SL to be close to the sensing electrode SE, so that the gate G connected to the sensing electrode SE has a voltage VSE. The voltage VSE is changed by the influence of different concentrations of the to-be-tested object in the to-be-tested solution SL. The transistor TFT generates the current IDS of different magnitudes according to the change of the voltage VSE, so as to detect the concentration of the to-be-tested object by comparing the current IDS with a known database. In addition, by comparing the difference between the reference voltage VRE and the voltage VSE with a known database, for example, the pH values of different to-be-tested solutions may be detected, but the present disclosure is not limited thereto.

In one embodiment of the present disclosure, the controller 500 may provide a negative-phase reference voltage to the reference electrode RE and, at this time, the to-be-tested object on the sensing electrode SE will be forced to desorb from the sensing electrode SE, which may be used to extend the service life of the sensing electrode SE. In this embodiment, although not shown, the controller 500 may include the reference voltage control unit 200 and the driving units 401 and 402 shown in FIG. 1, and thus a repeated description is deemed unnecessary.

Figure 4:
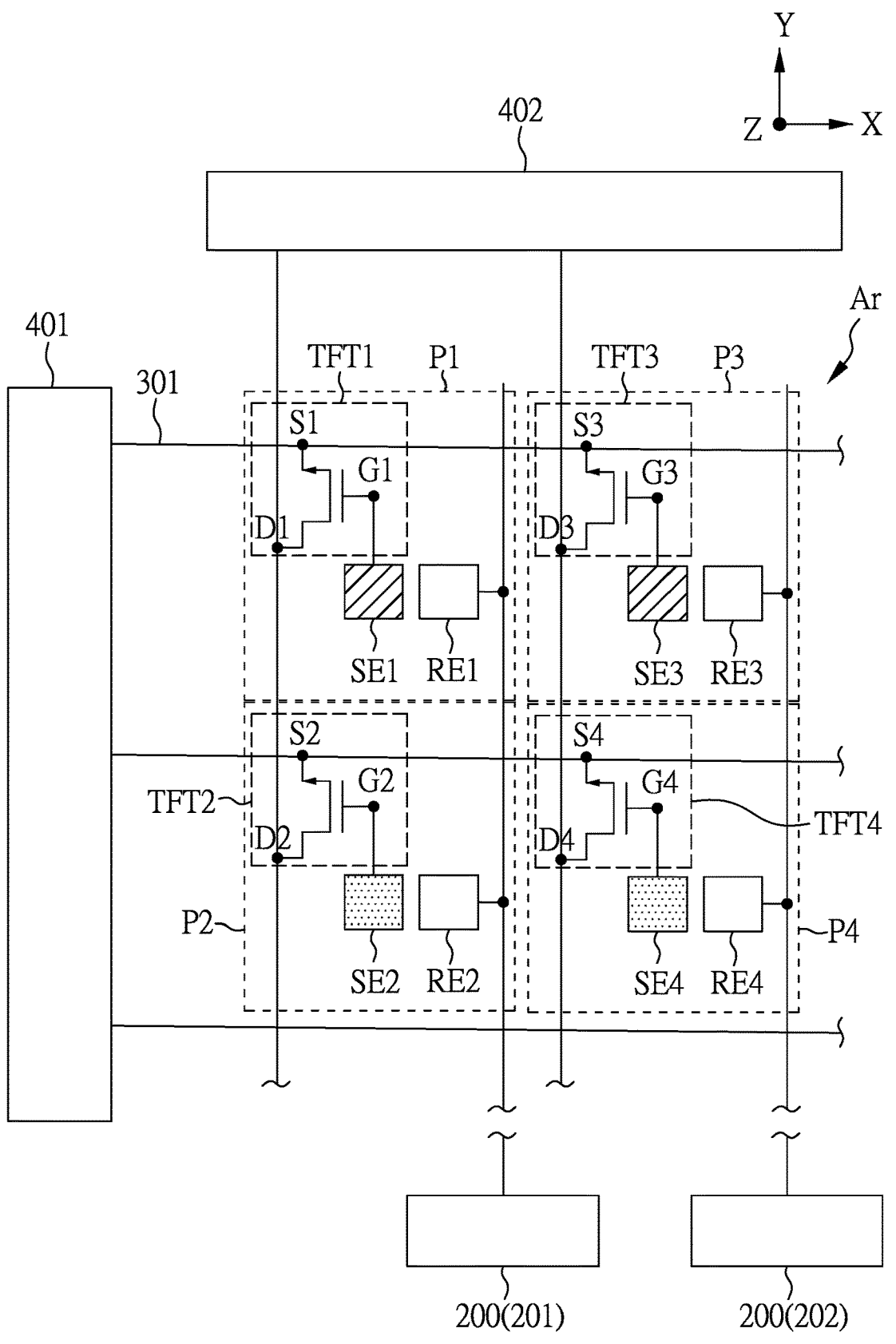
FIG. 4 is a schematic diagram of a sensing array of a sensing electronic device according to an embodiment of the present disclosure.

FIG. 4 is a schematic diagram of a sensing array of a sensing electronic device according to an embodiment of the present disclosure. The sensing array in FIG. 4 is similar to that in FIG. 1 except for the following differences.

As shown in FIG. 4, the sensing array Ar of this embodiment includes four sensing areas P1 to P4, and the four sensing areas are adjacent to each other and arranged in a 2×2 matrix, but the present disclosure is not limited thereto. As shown in FIG. 4, the sensing array Ar may include a first sensing area P1, a second sensing area P2, a third sensing area P3 and a fourth sensing area P4. The first sensing area P1 includes a first transistor TFT1; a first sensing electrode SE1 electrically connected to the first transistor TFT1; and a first reference electrode RE1 arranged corresponding to the first sensing electrode SE1. The second sensing area P2 includes a second transistor TFT2; a second sensing electrode SE2 electrically connected to the second transistor TFT2; and a second reference electrode RE2 arranged corresponding to the second sensing electrode SE2. The third sensing area P3 includes a third transistor TFT3; a third sensing electrode SE3 electrically connected to the third transistor TFT3; and a third reference electrode RE3 arranged corresponding to the third sensing electrode SE3. The fourth sensing area P4 includes a fourth transistor TFT4; a fourth sensing electrode SE4 electrically connected to the fourth transistor TFT4; and a fourth reference electrode RE4 arranged corresponding to the fourth sensing electrode SE4. The first transistor TFT1 is electrically connected to the third transistor TFT3, and the second transistor TFT2 is electrically connected to the fourth transistor TFT4. In more detail, the source S1 of the first transistor TFT1 is connected to the source S3 of the third transistor TFT3, and the source S2 of the second transistor TFT2 is electrically connected with the source S4 of the fourth transistor TFT4. Therefore, the signal of the first sensing area P1 may be connected in series with the signal of the third sensing area P3, and the signal of the second sensing area P2 may be connected in series with the signal of the fourth sensing area P4 so as to, for example, amplify the signal and improve detection reliability of the sensing electronic device, but the present disclosure is not limited thereto.

In addition, although not shown in the figures, a first sensing unit may be provided on the first sensing electrode SE1, and a second sensing unit may be provided on the second sensing electrode SE2, wherein the first sensing unit is different from the second sensing unit. In FIG. 4, the sensing electrodes with the same filling patterns represent that the sensing electrodes are provided with the sensing units of the same type, and the sensing electrodes with different filling patterns represent that the sensing electrodes are provided with sensing units of different types. More specifically, as shown in FIG. 4, the first sensing unit of the first sensing electrode SE1 is different from the second sensing unit of the second sensing electrode SE2, and the first sensing unit of the first sensing electrode SE1 is the same as the third sensing unit of the third sensing electrode SE3. Similarly, the first sensing unit of the first sensing electrode SE1 is different from the fourth sensing unit of the fourth sensing electrode SE4. Therefore, it can be used to detect different to-be-tested objects at the same time.

As shown in FIG. 4, in an operation period, when the reference voltage control unit 200 has a first voltage, that is, the reference voltage control unit 200 provides a first voltage to the first reference electrode RE1 and the second reference electrode RE2, the first sensing electrode SE1 has a second voltage, and the second sensing electrode SE2 has a third voltage, wherein the first reference electrode RE1 is adjacent to the second reference electrode RE2. Herein, in the "operation period", the to-be-tested solution containing the to-be-tested object is made to be in contact with the sensing electronic device of the present disclosure; for example, the sensing electronic device is soaked into the to-be-tested solution containing the to-be-tested object, or the to-be-tested solution containing the to-be-tested object is dropped on the sensing array of the sensing electronic device. Herein, the expression "has a voltage" means that when a voltage is provided to the reference electrode, the to-be-tested object in the to-be-tested solution will approach the sensing electrode, so that the gate electrode connected to the sensing electrode corresponding to the reference electrode has a voltage. In other embodiments of the present disclosure, the first reference electrode RE1 and the second reference electrode RE2 may be spaced apart from each other; that is, in the operation period, the reference electrodes of different rows or different columns may each have the first voltage or another voltage. With the above configuration, different to-be-tested objects may be detected simultaneously or the detection sensitivity and reliability may be further improved, but the present disclosure is not limited thereto.

Since the first sensing unit of the first sensing electrode SE1 is different from the second sensing unit of the second sensing electrode SE2, the second voltage of the first sensing electrode SE1 will be different from the third voltage of the second sensing electrode SE2. Therefore, the difference between the first voltage and the second voltage is different from the difference between the first voltage and the third voltage. More specifically, when there are two to-be-tested objects existed in the to-be-tested solution, and the two to-be-tested objects may be detected by the first sensing electrode SE1 and the second sensing electrode SE2, respectively, the first voltage is different from the second voltage and the third voltage, respectively, and the second voltage is different from the third voltage. Therefore, the difference between the first voltage and the second voltage is not equal to zero, and the difference between the first voltage and the third voltage is not equal to zero. Alternatively, when there is one to-be-tested object existed in the to-be-tested solution, and the to-be-tested object may be detected by the first sensing electrode SE1, the first voltage is different from the second voltage, while the first voltage is the same as the third voltage, so that the difference between the first voltage and the second voltage is not equal to 0, and the difference between the first voltage and the third voltage is 0.

In addition, as shown in FIG. 4, the reference voltage control unit 200 may include a first reference voltage control unit 201 and a second reference voltage control unit 202. The first reference voltage control unit 201 is electrically connected to the first reference electrode RE1 and the second reference electrode RE2 so as to provide a reference voltage. The second reference voltage control unit 202 may be electrically connected to the third reference electrode RE3 and the fourth reference electrode RE4 so as to provide another reference voltage. In an implementation aspect of the present disclosure, in an operation period, the reference voltage provided by the first reference voltage control unit 201 may be different from another reference voltage provided by the second reference voltage control unit 202. Therefore, the voltages of the first reference electrode RE1 and the second reference electrode RE2 may be different from the voltages of the third reference electrode RE3 and the fourth reference electrode RE4. In another implementation aspect of the present disclosure, in an operation period, the reference voltage provided by the first reference voltage control unit 201 may be the same as another reference voltage provided by the second reference voltage control unit 202, and thus the voltages of the first reference electrode RE1 and the second reference electrode RE2 may be the same as the voltage of the third reference electrode RE3 and the fourth reference electrode RE4. Herein, the "same voltage" means that the absolute value of the difference between two voltages is smaller than or equal to 0.02V.

In addition, in other implementation aspects of the present disclosure, the sensing areas P shown in FIG. 2A to FIG. 2C may be used to replace the sensing areas P1 to P4 shown in FIG. 4, while a detailed description is deemed unnecessary.

Figure 5:
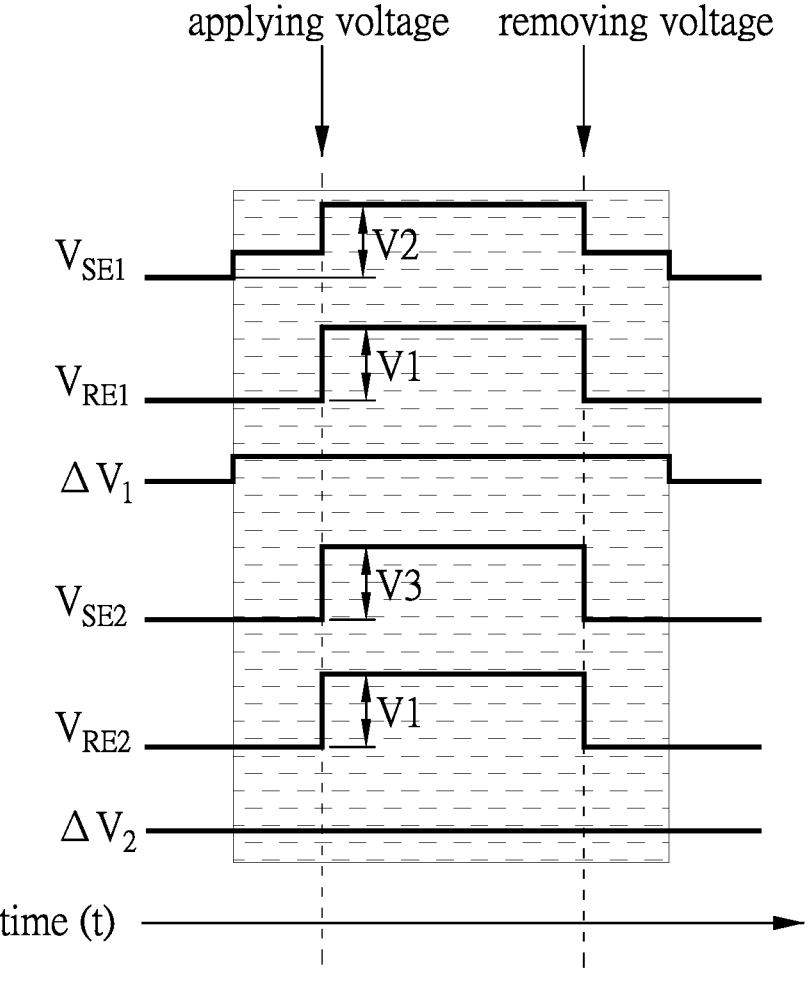
FIG. 5 is a graph showing the relationship between voltage and time of part of a sensing electronic device according to an embodiment of the disclosure.

FIG. 5 is a graph showing the relationship between voltage and time of part of the sensing electronic device according to an embodiment of the present disclosure. In this embodiment, the sensing electronic device including the sensing array shown in FIG. 4 is taken as an example. In FIG. 5, the filled pattern represents that the sensing electronic device is in contact with the to-be-tested solution.

As shown in FIG. 4 and FIG. 5, when the sensing electronic device is not in contact with the to-be-tested solution and no voltage is applied, the voltages of the first sensing electrode SE1, the first reference electrode RE1, the second sensing electrode SE2 and the second reference electrode RE2 are all 0V. When the sensing electronic device is in contact with the to-be-tested solution, the sensing unit of the sensing electrode starts to adsorb the to-be-tested object, so that the sensing electrode that adsorbs the to-be-tested object will have a voltage. Taking this embodiment as an example, it can be seen that the to-be-tested solution contains the to-be-tested object that may be detected by the first sensing electrode SE1, but does not contain the to-be-tested object that may be detected by the second sensing electrode SE2. Therefore, after the sensing electronic device is in contact with the to-be-tested solution, the voltage VSE1 of the first sensing electrode SE1 is not 0V, while the voltage VSE2 of the second sensing electrode SE2 is still 0V. Then, when the first voltage V1 is provided to the first reference electrode RE1 and the second reference electrode RE2, the first sensing electrode SE1 will have the second voltage V2, and the second sensing electrode SE2 will have the third voltage V3. Then, after the first voltage V1 is removed, the voltages of the first reference electrode RE1, the second reference electrode RE2 and the second sensing electrode SE2 that does not detect the to-be-tested object return to 0V, while the first sensing electrode SE1 is continuously affected by the to-be-tested object so that the voltage VSE1 is not 0V. Afterwards, when the sensing electronic device is not in contact with the to-be-tested solution, the voltage of the first sensing electrode SE1 returns to 0V, and the voltages of the first reference electrode RE1, the second reference electrode RE2 and the second sensing electrode SE2 are maintained at 0V. Herein, the "voltage of the sensing electrode" refers to the gate voltage of the transistor electrically connected to the sensing electrode.

Since the first sensing electrode SE1 is affected by the to-be-tested object, the second voltage V2 will be different from the first voltage V1, and thus the difference ΔV1 between the first voltage V1 and the second voltage V2 is not equal to 0. The second sensing electrode SE2 is not affected by the to-be-tested object, so that the third voltage V3 is the same as the first voltage V1, and thus the difference ΔV2 between the first voltage V1 and the third voltage V3 is 0. Through the implementation aspects of the present disclosure, the purpose of detecting different to-be-tested objects in the same operation period can be achieved so as to reduce the operation time, but the present disclosure is not limited thereto.

Figure 6:
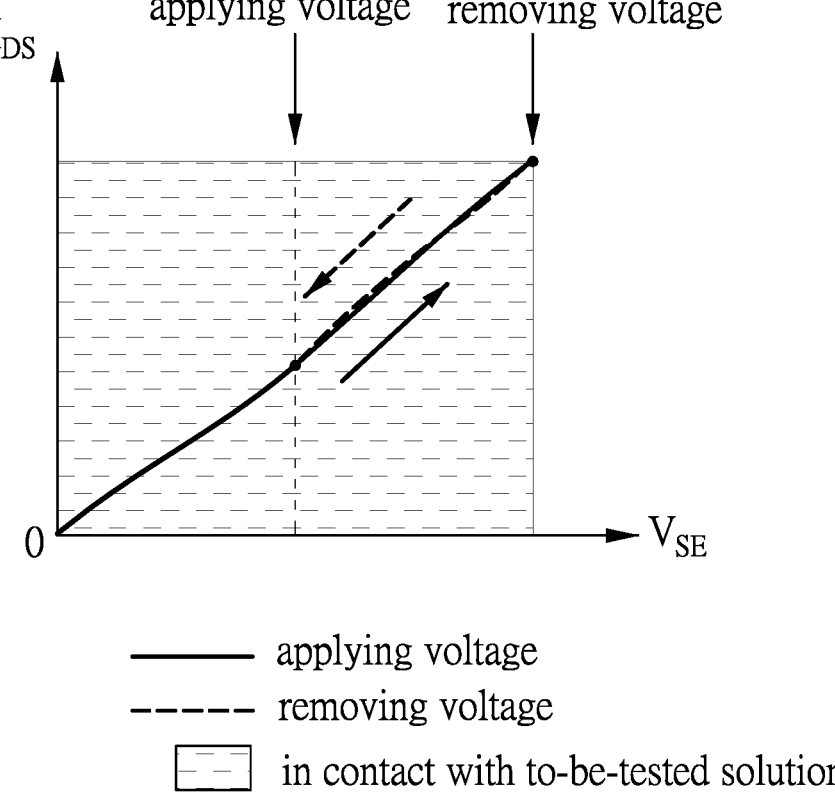
FIG. 6 is a graph showing the relationship between voltage and current of part of a sensing electronic device according to an embodiment of the disclosure.

FIG. 6 is a graph showing the relationship between voltage and current of part of the sensing electronic device according to an embodiment of the present disclosure. In FIG. 6, the pattern of filled lines indicates that the sensing electronic device is in contact with the to-be-tested solution.

As shown in FIG. 6, when the sensing electronic device is in contact with the to-be-tested solution, since the sensing unit of the sensing electrode will start to adsorb the to-be-tested object, the voltage VSE of the sensing electrode that adsorbs the to-be-tested object will be is greater than 0V, and the voltage may have a corresponding current IDS. The "current" refers to the current magnitude of the source-drain of the transistor electrically connected to the sensing electrode. When a voltage is applied to the reference electrode, the corresponding sensing electrode will have a voltage, and the voltage may correspond to a current. Therefore, the concentration of the to-be-tested object may be known by comparing the current with a known database, but the present disclosure is not limited thereto.

Figure 7:
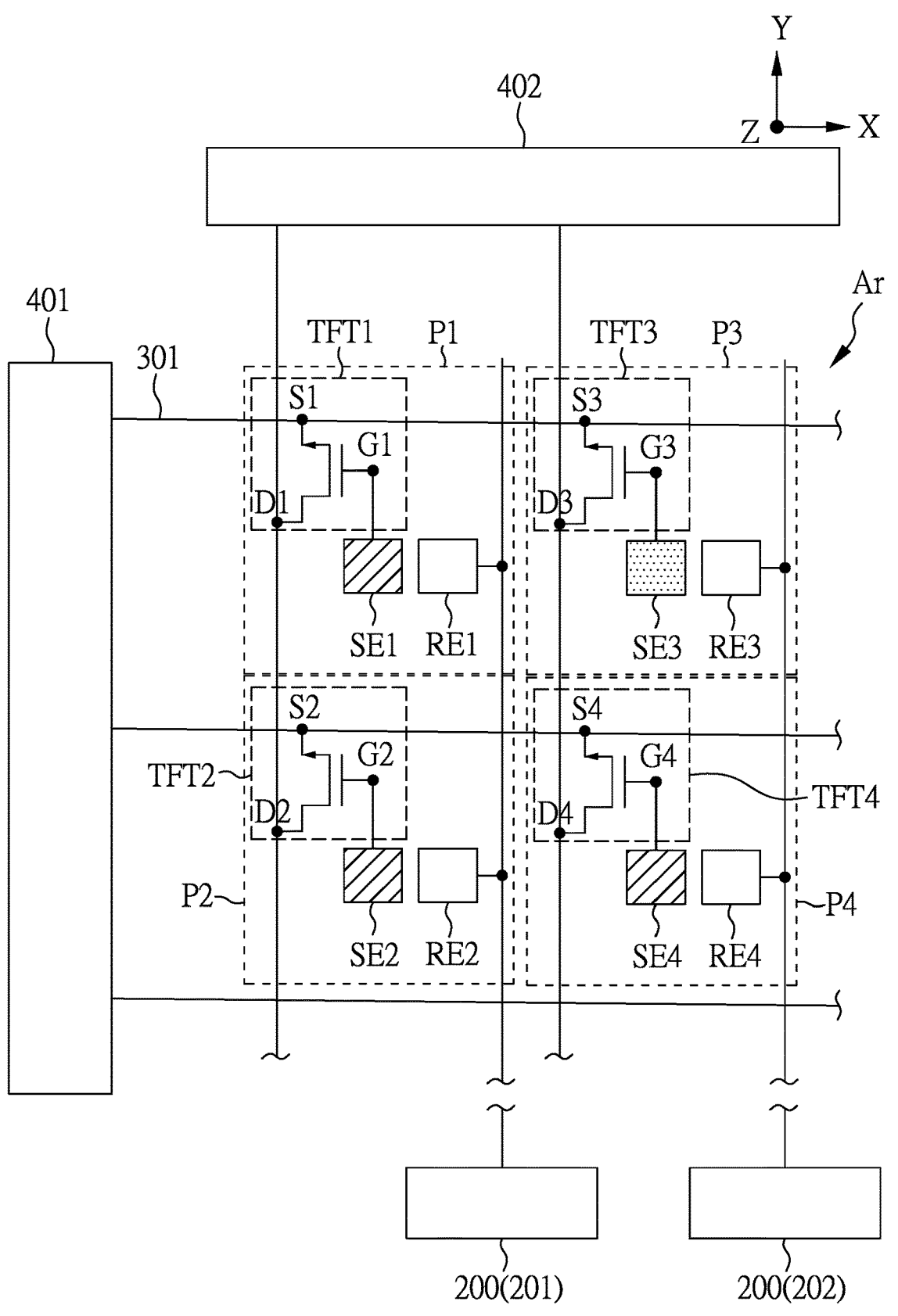
FIG. 7 is a schematic diagram of a sensing array of a sensing electronic device according to an embodiment of the disclosure.

FIG. 7 is a schematic diagram of a sensing array of a sensing electronic device according to an embodiment of the present disclosure. The sensing array in FIG. 7 is similar to that in FIG. 4 except for the following differences. In FIG. 7, the sensing electrodes with the same filling pattern represent the sensing electrodes with the sensing units of the same type, and the sensing electrodes with different filling patterns represent the sensing electrodes with the sensing units of different types.

As shown in FIG. 7, the first sensing unit of the first sensing electrode SE1 is the same as the second sensing unit of the second sensing electrode SE2 and the fourth sensing unit of the fourth sensing electrode SE4, and the first sensing unit of the first sensing electrode SE1 is different from the third sensing unit of the third sensing electrode SE3, so that the sensing electronic device of the present disclosure may be used to simultaneously detect different to-be-tested objects. In an operation period, the first reference voltage control unit 201 may provide a reference voltage, and the second reference voltage control unit 202 may provide another reference voltage, wherein the reference voltage and another reference voltage may be the same or different. When the to-be-tested solution contains the to-be-tested object that may be detected by the first sensing electrode SE1 but does not contain the to-be-tested object that may be detected by the third sensing electrode SE3, the relationship between the voltage and time is similar to that shown in FIG. 5. In more detail, when the reference voltage provided by the first reference voltage control unit 201 to the first reference electrode RE1 is the same as another reference voltage provided by the second reference voltage control unit 202 to the third reference electrode RE3, and both voltages are equal to the first voltage V1 (as shown by VRE1 and VRE2 in FIG. 5), the first sensing electrode SE1 will have a second voltage V2, and the third sensing electrode SE3 will have a third voltage V3 (as shown in VSE2 in FIG. 5). Since the first sensing electrode SE1 is affected by the to-be-tested object, the second voltage V2 will be different from the first voltage V1, and thus the difference ΔV1 between the first voltage V1 and the second voltage V2 is not equal to 0V. The third sensing electrode SE3 is not affected by the to-be-tested object and, similar to VSE2 in FIG. 5, the third voltage V3 will be the same as the first voltage V1, so that the difference ΔV2 between the first voltage V1 and the third voltage V3 is 0V, but the present disclosure is not limited thereto.

Figure 8:
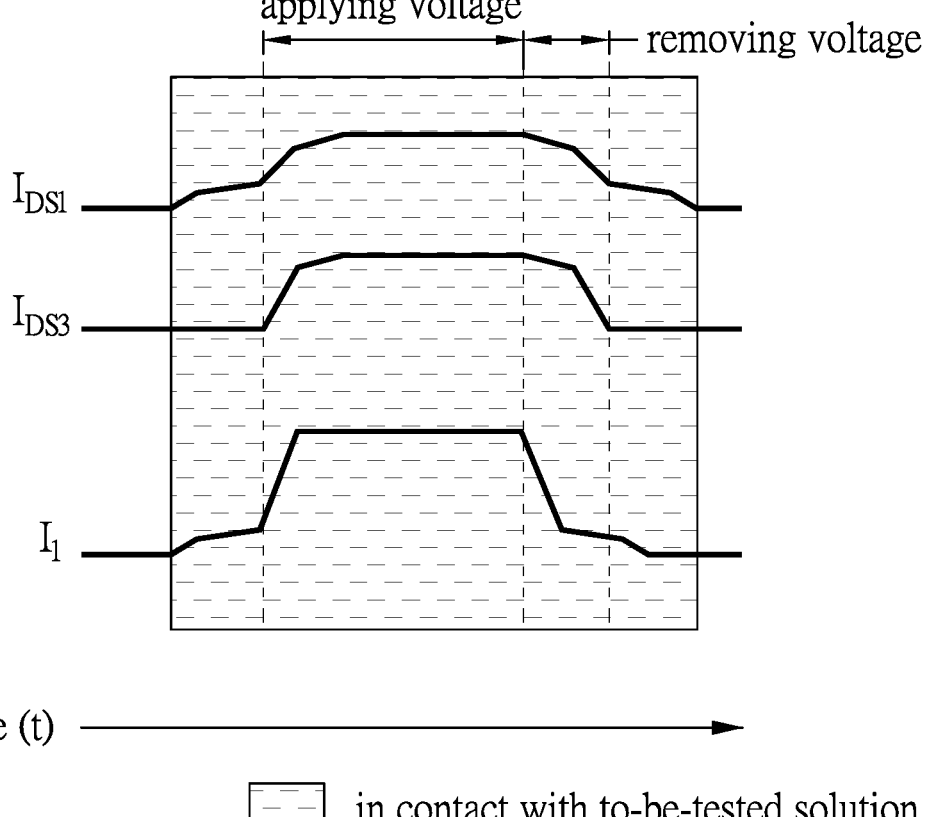
FIG. 8 is a graph showing the relationship between current and time of part of a sensing electronic device according to an embodiment of the disclosure.

FIG. 8 is a graph showing the relationship between current and time of part of the sensing electronic device according to an embodiment of the present disclosure. In this embodiment, the sensing electronic device including the sensing array shown in FIG. 7 is taken as an example. In FIG. 8, the pattern of filled lines indicates that the sensing electronic device is in contact with the to-be-tested solution.

In this embodiment, as shown in FIG. 7 and FIG. 8, the to-be-tested solution contains the to-be-tested object that may be detected by the first sensing electrode SE1, but does not contain the to-be-tested object that may be detected by the third sensing electrode SE3. After the sensing electronic device is in contact with the to-be-tested solution, the first sensing electrode SE1 is affected by the to-be-tested object, and a corresponding current IDS1 will be generated, while the third sensing electrode SE3 is not affected by the to-be-tested object, and the corresponding current IDS3 is 0V. When applying voltage to the first reference electrode RE1 and the third reference electrode RE3, the first sensing electrode SE1 and the third sensing electrode SE3 generate corresponding currents IDS1 and IDS3, respectively. After removing the voltage of the first reference electrode RE1 and the third reference electrode RE3, the current IDS3 of the third sensing electrode SE3 returns to 0V, while the first sensing electrode SE1 is continuously affected by the to-be-tested object, and the current IDS1 is not 0V. Then, when the sensing electronic device is not in contact with the to-be-tested solution, the current IDS1 of the first sensing electrode SE1 returns to 0V, and the current IDS3 of the third sensing electrode SE3 remains at 0V. Herein, the "current of the sensing electrode" refers to the source-drain current of the transistor electrically connected to the sensing electrode.

As shown in FIG. 7, the first transistor TFT1 of the first sensing area P1 is electrically connected to the third transistor TFT3 of the third sensing area P3, that is, in more detail, the source S1 of the first transistor TFT1 is electrically connected to the source S3 of the third transistor TFT3, and thus the current signal of the first sensing electrode SE1 may be connected in series with the current signal of the third sensing electrode SE3 for signal amplification, and its net current may be shown as I1 in FIG. 8. By comparing the current with a known database, the concentration of the to-be-tested object may be obtained, but the present disclosure is not limited thereto.

The aforementioned specific embodiments should be construed as merely illustrative, and not limiting the rest of the present disclosure in any way.

The invention claimed is:

1. A sensing electronic device, comprising:
a substrate;
a sensing array arranged on the substrate, and including a first sensing area, a second sensing area, a third sensing area and a fourth sensing area arranged in a matrix form, wherein the first sensing area includes: a first transistor, a first sensing electrode electrically connected to the first transistor, a first sensing unit arranged on the first sensing electrode and a first reference electrode arranged corresponding to the first sensing electrode, the second sensing area includes: a second transistor, a second sensing electrode electrically connected to the second transistor, a second sensing unit arranged on the second sensing electrode and a second reference electrode arranged corresponding to the second sensing electrode, the third sensing area includes: a third transistor, a third sensing electrode electrically connected to the third transistor, a third sensing unit arranged on the third sensing electrode and a third reference electrode arranged corresponding to the third sensing electrode, and the fourth sensing area includes: a fourth transistor, a fourth sensing electrode electrically connected to the fourth transistor, a fourth sensing unit arranged on the fourth sensing electrode and a fourth reference electrode arranged corresponding to the fourth sensing electrode;
a first reference voltage control unit electrically connected to the first reference electrode and the second reference electrode to provide a first reference voltage; and
a second reference voltage control unit electrically connected to the third reference electrode and the fourth reference electrode to provide a second reference voltage,
wherein, the first transistor is electrically connected to the third transistor, and the second transistor is electrically connected to the fourth transistor;
wherein, in an operation period, the first reference voltage is different from the second reference voltage.

2. The sensing electronic device as claimed in claim 1, wherein the first sensing unit of the first sensing electrode is different from the second sensing unit of the second sensing electrode, and the first sensing unit of the first sensing electrode is the same as the third sensing unit of the third sensing electrode.

3. The sensing electronic device as claimed in claim 1, wherein each of the transistors includes a gate; part of a gate insulation layer arranged on the gate; an active layer arranged on the gate insulation layer and arranged on the gate; and a source and a drain arranged on the active layer and respectively electrically connected to the active layer.

4. The sensing electronic device as claimed in claim 3, wherein the source of the first transistor is electrically connected to the source of the third transistor, and the source of the second transistor is electrically connected to the source of the fourth transistor.

5. The sensing electronic device as described in claim 1, wherein the first sensing unit of the first sensing electrode is the same as and the second sensing unit of the second sensing electrode and the fourth sensing unit of the fourth sensing electrode, and the first sensing unit of the first sensing electrode is different from the third sensing unit of the third sensing electrode.

6. The sensing electronic device as claimed in claim 5, wherein a source of the first transistor is electrically connected to a source of the third transistor, and a source of the second transistor is electrically connected to a source of the fourth transistor.

* * * * *